United States Patent [19]
Li

[11] Patent Number: 6,050,217
[45] Date of Patent: Apr. 18, 2000

[54] PARALLEL PLATE PLASMA CVD APPARATUS

[75] Inventor: Xiao-min Li, Shiga-ken, Japan

[73] Assignee: Murata Manufacturing Co., Ltd., Japan

[21] Appl. No.: 09/139,922

[22] Filed: Aug. 26, 1998

[30] Foreign Application Priority Data

Aug. 26, 1997 [JP] Japan .................................. 9-246193

[51] Int. Cl.⁷ .............................. H05H 1/00; C23C 16/00
[52] U.S. Cl. ........................................................ 118/723 E
[58] Field of Search ........................... 118/723 E, 723 R; 156/345

[56] References Cited

U.S. PATENT DOCUMENTS

| 5,242,532 | 9/1993 | Cain ........................................ 156/345 |
| 5,248,371 | 9/1993 | Maher et al. ........................... 156/345 |

FOREIGN PATENT DOCUMENTS

| 59-37566 | 9/1984 | Japan . |
| 60-12773 | 4/1985 | Japan . |
| 7-25545 | 3/1995 | Japan . |
| 8-167596 | 6/1996 | Japan . |

OTHER PUBLICATIONS

J.W. Coburn, et al., "Positive–ion bombardment of substrates in rf diode glow discharge sputtering", J. Appll Phys., vol. 43, No. 12, Dec. 1972.

A. Matsuda, et al., "Plasma Spectroscopy—glow discharge deposition of hydrogenated amorphous silicon", Thin Solid Films, 92, 171–187 (1982).

Primary Examiner—Thi Dang
Attorney, Agent, or Firm—Ostrolenk, Faber, Gerb & Soffen, LLP

[57] ABSTRACT

A parallel plate plasma CVD apparatus comprises a radio-frequency generator; a reaction chamber; a bottom electrode provided in the reaction chamber and grounded; a top electrode provided opposite to the bottom electrode in the reaction chamber and connected to the radio-frequency generator; a mesh electrode provided between the bottom electrode and the top electrode in the reaction chamber; and one of a resistor and a capacitor electrically connected between the bottom electrode and the mesh electrode.

8 Claims, 3 Drawing Sheets

PARALLEL PLATE PLASMA CVD APPARATUS

BACKGROUND OF THE INVENTION

1. Field of the Invention

The present invention relates to a parallel plate plasma CVD (Chemical Vapor Deposition) apparatus, and in particular, to a parallel plate plasma CVD apparatus used in production of a titanium oxide thin film, which is used for a microwave monolithic IC (hereinafter referred to as MMIC).

2. Description of the Related Art

Various methods for forming metal oxide thin films or dielectric thin films have been proposed. Examples of such methods are disclosed in, for example, Japanese Patent Publication (Kokoku) Nos. 59-37566, 60-12773, and 7-25545. Included in these publications is a report that a titanium oxide thin film can be formed using a CVD process. However, to carry out this method the substrate temperature must be high, for example, 500° C. or more, during the film deposition step. This adversely affects the underlying substrate used for the device formation as well as other devices formed on the substrate. For example, if the temperature is high when MMIC capacitors are formed, characteristics of the underlying substrate such as GaAs and transistors deteriorate. To reduce this problem, a film deposition method which uses plasma generated in a deposition chamber during a CVD process (herein after referred to as a plasma CVD process) has been frequently used.

In a conventional parallel plate plasma CVD apparatus using a radio-frequency generator (13.56 MHz), a gaseous mixture is supplied into a glow discharge region between a top electrode (a radio-frequency input electrode) and a bottom electrode (a ground electrode), and activated for reaction in the mixture to deposit a film on a substrate located on the bottom electrode. The plasma must have a considerably high power density to decompose the gases sufficiently.

However, since the surface of the substrate on which the film is deposited is located near the plasma generation region, high-energy particles generated by plasma discharge frequently attack the substrate surface. This may cause deterioration of film characteristics, that is, the film may be damaged or deposited abnormally by the impact of particles having excessive energy.

In order to solve the problem, proposals have been made to moderate the particle impact by, for example, controlling the self-bias near the substrate. For example, J. W. Coburn et al. disclosed a method for controlling ions and radicals incident on the substrate by applying a direct current flow without grounding the bottom electrode supporting the substrate in J. Appl. Phys., 43, 4965 (1972). A. Matsuda et al. disclosed a triode configuration consisting of parallel plate electrodes and a mesh electrode interposed therebetween in Thin solid Films, 92, 171 (1982).

FIG. 3 is a schematic view illustrating the fundamental components of a conventional triode-type plasma CVD apparatus. A bottom electrode 2 and a top electrode 3 are arranged opposite to one other in a reaction chamber (not shown). The bottom electrode 2 is connected to an external DC electrical power source 4. A substrate S on which a dielectric thin film is to be formed is placed on the bottom electrode 2. The top electrode 3 is connected to a radio-frequency generator 5. A grooved mesh electrode 6 is located between the bottom electrode 2 and the top electrode 3 and a DC bias current is applied between the mesh electrode 6 and the bottom electrode 2.

In all of the above-mentioned methods for moderating particle impact, the bottom electrode must float electrically. However, as shown in FIG. 3, the bottom electrode of the conventional plasma CVD apparatus is generally connected to the body of the reaction chamber and grounded. Thus, the conventional plasma CVD apparatus cannot be used to carry out the foregoing methods.

Accordingly, there is a need for a parallel plate plasma CVD apparatus which moderates damage to the substrate during the film deposition process, forms high-quality dielectric thin films, and permits the use of a modified conventional plasma CVD apparatus.

SUMMARY OF THE INVENTION

The present invention is directed to a parallel plate plasma CVD apparatus that satisfies this need. The parallel plate plasma CVD apparatus comprise a radio-frequency generator, a reaction chamber, a bottom electrode provided in the reaction chamber and grounded, a top electrode provided opposite to the bottom electrode in the reaction chamber and connected to the radio-frequency generator, a mesh electrode provided between the bottom electrode and the top electrode in the reaction chamber; and one of a resistor and a capacitor electrically connected between the bottom electrode and the mesh electrode.

In the parallel plate plasma CVD apparatus in accordance with the present invention, the mesh electrode and the bottom electrode are electrically connected to each other with a resistor or capacitor provided therebetween, the plasma generated between the top electrode and the mesh electrode has high effective power. Since the plasma discharge region and the thin film deposition region are spatially separated from each other by the mesh electrode, the particle impact on the thin film deposition surface is controlled by a potential of the mesh electrode even when the plasma density is increased for decomposition and reaction of the material gas. Thus, the use of the apparatus in accordance with the present invention decreases the temperature for the formation of thin films compared with conventional CVD process, for example, permits the deposition of a titanium oxide thin film at a temperature of 350° C. or less. Consequently, a thin film having a high dielectric constant and reduced leakage can be formed at a low temperature. In the device production, adverse effects on the substrate and other circuits are also suppressed. In the parallel plate plasma CVD apparatus in accordance with the present invention, the bottom electrode is grounded, hence the present invention can be achieved by diverting a general plasma CVD apparatus.

In the parallel plate plasma CVD apparatus in accordance with the present invention, the resistor preferably has a resistance of 1 MΩ or less.

A thin film having satisfactory characteristics is deposited using a resistor having a resistance of 1 MΩ or less.

In the parallel plate plasma CVD apparatus in accordance with the present invention, the capacitor preferably has an electrostatic capacitance of 1 µF or less.

A thin film having satisfactory characteristics is deposited using a capacitor having an electrostatic capacitance of 1 µF or less.

BRIEF DESCRIPTION OF THE DRAWINGS

For the purpose of illustrating the invention, there is shown in the drawings several forms which are presently

DETAILED DESCRIPTION OF PREFERRED EMBODIMENTS

Hereinafter, the preferred embodiments of the present invention are explained in detail with reference to the drawings.

Figure 1:
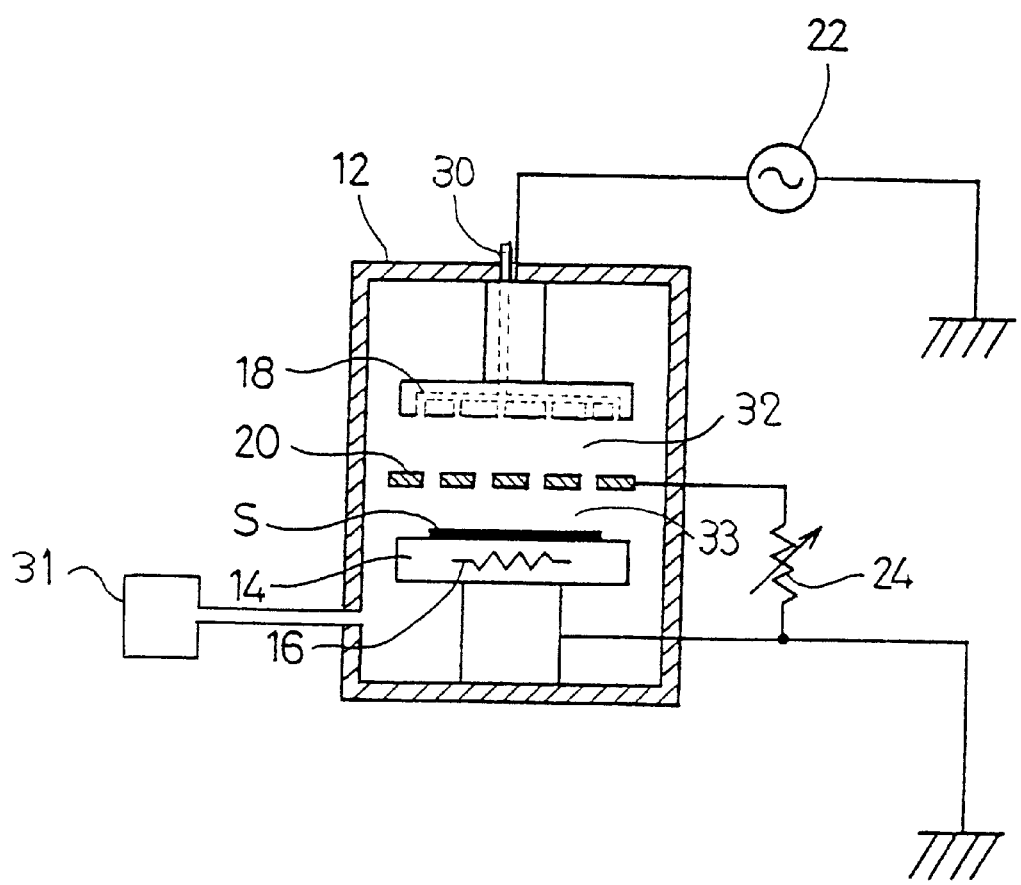
FIG. 1 is a schematic view illustrating an embodiment of a parallel plate plasma CVD apparatus in accordance with the present invention.

FIG. 1 is a schematic view illustrating a first embodiment of a parallel plate plasma CVD apparatus constructed in accordance with the principles of the present invention. The plasma CVD apparatus 10 includes the fundamental components of a conventional parallel plate plasma CVD apparatus. Thus, the plasma CVD apparatus 10 has a reaction chamber 12 in which grounded bottom electrode 14 and a top electrode 18 (connected to an RF generator 22) is arranged. A substrate S, on which a dielectric thin film is to be formed, is placed on the bottom electrode 14. A gas inlet 30 is provided in the top electrode 18. The gas inlet 30 includes a plurality of openings arranged in a matrix in the top electrode 18 and introduces material gases into the reaction chamber 12.

In this plasma CVD apparatus 10, a mesh electrode 20 is arranged between and generally parallel to the bottom electrode 14 and the top electrode 18. The mesh electrode 20 is preferably a network electrode provided with a plurality of openings, and is formed of a SUS304 expand metal (Japanese Industrial Standard) having a rhombic network of 7 mm by 14 mm. The area between the top electrode 18 and the mesh electrode 20 provide a glow discharge space for generating plasma.

A vacuum pump 31 is connected to the reaction chamber 12 to maintain the atmosphere in the reaction chamber 12 at a desired low pressure.

A variable resistor 24 connects the bottom electrode 14 and the mesh electrode 20. Changing the resistance of the variable resistor 24 controls the potential of the mesh electrode 20. By selecting an optimized resistance, which is dependent on the film deposition conditions and the applied power, a high-quality film can be produced. Preferably, the resistance of the variable resistor 24 can be adequately controlled within a range of, for example, 1 MΩ.

The components not described here are common to that of the conventionally used plasma CVD apparatus.

The materials for the mesh electrode 20 is not limited to the above description, and thus may include various types of materials which do not cause contamination of the thin film. The shape and size of the network of the mesh electrode may be selected to ensure that the decomposed gas reaches the surface of substrates.

In the deposition of a dielectric thin film using the plasma CVD apparatus 10, the substrate S is placed on the bottom electrode 14 in the reaction chamber 12. While evacuating the reaction chamber 12 to a predetermined pressure using the pump 31, the heater 16 heats the substrate S to a desired temperature. A source gas is vaporized by a vaporizer (not shown) and is mixed with oxygen. The mixture is introduced into the reaction chamber 12 through a gas inlet 30. At the same time, a radio-frequency voltage of 13.56 MHz is applied to the top electrode 18 to cause plasma in the glow discharge region 32 between the top electrode 18 and the mesh electrode 20. The plasma passes through the openings of the mesh electrode 20 and is deposited on the substrates. The source gas is decomposed and allowed to react in such a manner that the reaction products deposit on the substrate S to form a dielectric thin film.

According to the present invention, the mesh electrode 20 is disposed between the top electrode 18 and the bottom electrode 14. Since the mesh electrode 20 is located closer to the top electrode 18 than the bottom electrode 14, the space charge density (amount of charge per unit area) of the plasma in the glow discharge region 32 between the top electrode 18 and the mesh electrode 20 is increased. This increases the effective power of the plasma generation, and makes it possible to carry out the vapor deposition at a relatively low temperature.

The particles of plasma are then passed through the openings of the mesh electrode 20 and enter the region between the mesh electrode 20 and the bottom electrode 16. Since the variable resistor 24 is connected between the mesh electrode 20 and the bottom electrode 16, the force of the collision of the particles in the plasma onto the growth surface of the thin film deposited on the upper surface of substrate S can be controlled by adjusting the bias voltage of mesh electrode 20 using the variable resistor 24.

Figure 2:
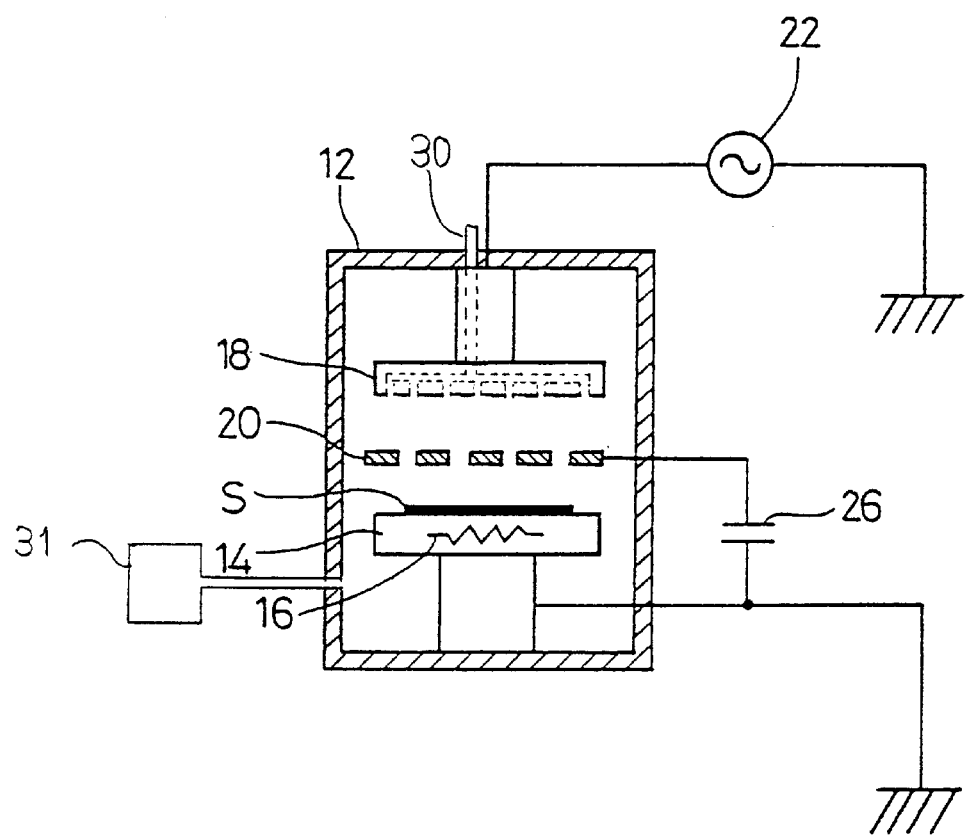
FIG. 2 is a schematic view illustrating another embodiment of a parallel plate plasma CVD apparatus in accordance with the present invention.
Figure 3:
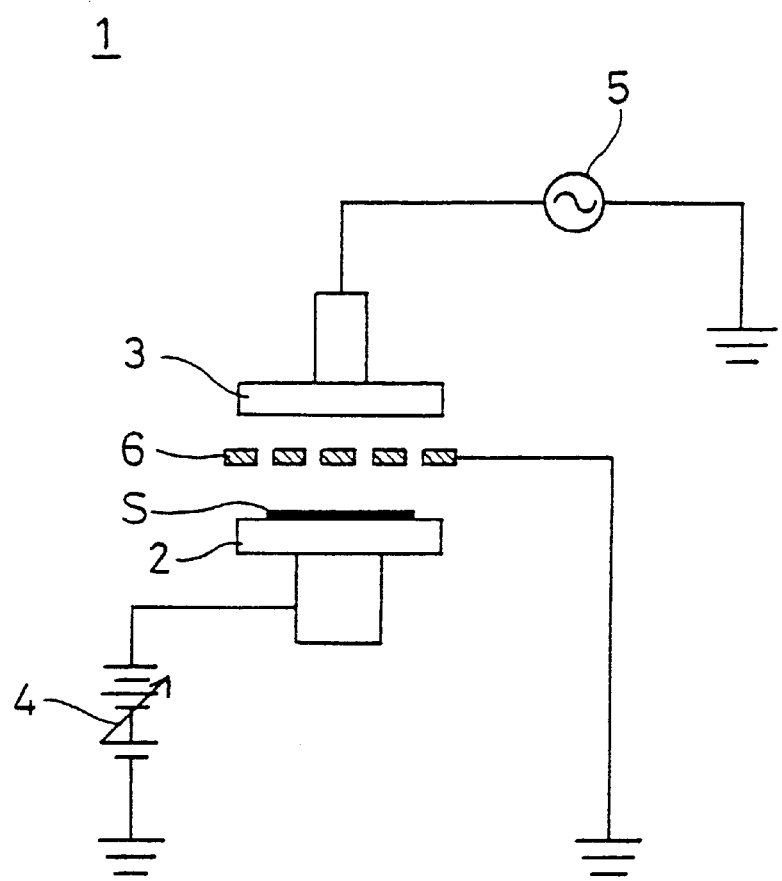
FIG. 3 is a schematic view illustrating a fundamental components of a conventional triode plasma CVD apparatus.

FIG. 2 is a schematic view illustrating a second embodiment of the parallel plate plasma CVD apparatus in accordance with the present invention. The plasma CVD apparatus 10 shown in FIG. 2 is different from that shown in FIG. 1 only in that a capacitor 26 is used in lieu of the variable resistor 24. By changing capacitor 26, it is possible to change the mesh potential. It is possible to optimize the electrostatic capacitance to match the film deposition conditions to result in an applied power which is capable of forming a high-quality film. A variable capacitor may also be used.

EXAMPLES

Examples of production of thin films using the parallel plate plasma CVD apparatus in accordance with the present invention will now be described.

Example 1 includes the formation of a titanium oxide thin film under the conditions shown in Table 1 using the parallel plate plasma CVD apparatus 10 shown in FIG. 1, while setting the resistance of the variable resistor 24 to 1 kΩ. $Ti(O-i-C_3H_7)_4$ was used as a Ti source. Since this material was liquid at room temperature, it was heated to a temperature of 40° C. to 45° C. to cause vaporization of the liquid, and was transferred by bubbling of a carrier gas into the liquid source. Ar was used as a carrier gas. $N_2$ gas may also be used.

TABLE 1

| | |
|---|---|
| Raw material | $Ti(O-i-C_3H_7)_4$ |
| Temperature of material | 40 to 45° C. |
| Ar carrier gas flow rate | 20 to 50 CCM |
| $O_2$ gas flow rate | 20 to 30 CCM |
| Pressure of deposition chamber | 0.2 to 0.4 Torr |
| Substrate temperature | 350° C. |
| Power for generating plasma | 100 W |

TABLE 1-continued

| | |
|---|---|
| Distance between electrodes | 20 to 25 mm |
| Film deposition time | 120 to 180 min. |

Electrodes having a diameter of 0.5 mm (and an area of $1.96 \times 10^{-3}$ cm$^2$) were formed, the thickness, electrostatic capacitance, relative dielectric constant, dielectric loss (tan δ) and insulation resistance (logIR) of the resulting titanium oxide thin film were determined. The results are shown in Table 2, wherein the electrostatic capacitance and the dielectric loss are values for 1 MHz, and the insulation resistance is a value for an applied voltage of 1 V.

As a comparative example, a titanium oxide thin film formed at a resistance of 0 was subjected to the measurement with the same condition. The results are also shown in Table 2.

In Example 2, the parallel plate plasma CVD apparatus 10 shown in FIG. 2 was used and a titanium oxide thin film was formed under similar conditions, while setting the capacitance of the capacitor 26 at 0.7 μF. The characteristics of the resulting titanium oxide were measured as described above. The results are also shown in Table 2.

TABLE 2

| Example | Value of series capacitor or resistor | thickness (nm) | Electrostatic capacitor (pF) | Relative dielectric constant | tan δ (%) | logIR (Ω) |
|---|---|---|---|---|---|---|
| 1 | R = 1 kΩ | 225 | 367.3 | 46.6 | 2.3 | 8.1 |
| 2 | C = 0.7 μF | 205 | 278.8 | 32.2 | 2.1 | 9.4 |
| Comp. Exp. | R = 0 | 225 | 416.9 | 52.8 | 8.9 | 9.3 |

As shown in Table 2, dielectric films obtained using the parallel plate plasma CVD apparatus 10 constructed in accordance with the principles of the present invention have an excellent dielectric loss (tan δ) and other properties.

As explained above, the parallel plate plasma CVD apparatus constructed in accordance with the principles of the present invention has a configuration in which the grounded bottom electrode is connected to the mesh electrode by a resistor or capacitor. Thus, the commonly used parallel plate plasma CVD apparatus can be easily modified to conform to the principles of the present invention. Further, when the power density of the plasma is increased and the potential of the mesh electrode is simultaneously controlled, a titanium oxide film as a dielectric thin film having a high dielectric constant and a high insulating resistance is obtainable at a temperature of 350° C. or less. Consequently, damage of the substrate and other devices by heat or high energy particles is suppressed in the formation of the dielectric thin film, and high-quality devices such as a MMIC are obtainable.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A parallel plate plasma CVD apparatus comprising:
   a radio-frequency generator;
   a reaction chamber;
   a grounded bottom electrode located in the reaction chamber;
   a top electrode opposing the bottom electrode in the reaction chamber and connected to the radio-frequency generator;
   a mesh electrode provided in the reaction chamber between the bottom electrode and the top electrode; and
   at least one resistor electrically connected between the bottom electrode and the mesh electrode.

2. A parallel plate plasma CVD apparatus according to claim 1, wherein the resistor has a resistance of 1 MΩ or less.

3. A parallel plate plasma CVD apparatus according to claim 1, further comprising a gas inlet provided in the top electrode.

4. A parallel plate plasma CVD apparatus according to claim 1, wherein only one resistor is electrically connected between the bottom electrode and the mesh electrode.

5. A parallel plate plasma CVD apparatus comprising:
   a radio-frequency generator;
   a reaction chamber;
   a grounded bottom electrode located in the reaction chamber;
   a top electrode opposing the bottom electrode in the reaction chamber and connected to the radio-frequency generator;
   a mesh electrode provided in the reaction chamber between the bottom electrode and the top electrode; and
   at least one capacitor electrically connected between the bottom electrode and the mesh electrode.

6. A parallel plate plasma CVD apparatus according to claim 5, wherein the capacitor has an electrostatic capacitance of 1 μF or less.

7. A parallel plate plasma CVD apparatus according to claim 5, further comprising a gas inlet provided in the top electrode.

8. A parallel plate plasma CVD apparatus according to claim 5, wherein only one capacitor is electrically connected between the bottom electrode and the mesh electrode.

* * * * *